(12) United States Patent
Lin

(10) Patent No.: US 8,310,381 B2
(45) Date of Patent: Nov. 13, 2012

(54) CAPACITIVE KEY TOUCH SENSING USING ANALOG INPUTS AND DIGITAL OUTPUTS

(75) Inventor: Chien-Yi Lin, Taipei (TW)

(73) Assignee: Microchip Technology Incorporated, Chandler, AZ (US)

(*) Notice: Subject to any disclaimer, the term of this patent is extended or adjusted under 35 U.S.C. 154(b) by 341 days.

(21) Appl. No.: 12/794,153

(22) Filed: Jun. 4, 2010

(65) Prior Publication Data

US 2011/0074609 A1 Mar. 31, 2011

Related U.S. Application Data

(60) Provisional application No. 61/246,169, filed on Sep. 28, 2009.

(51) Int. Cl.
*H03K 17/94* (2006.01)
(52) U.S. Cl. ........... 341/33; 341/22; 341/34; 178/18.06; 178/18.07; 345/168; 345/173
(58) Field of Classification Search .................... 341/22, 341/33, 34; 178/18.06, 18.07; 345/168, 345/173
See application file for complete search history.

(56) References Cited

U.S. PATENT DOCUMENTS

| | | | |
|---|---|---|---|
| 6,452,514 B1 | 9/2002 | Philipp | 341/33 |
| 6,466,036 B1* | 10/2002 | Philipp | 324/678 |
| 7,598,752 B2* | 10/2009 | Li | 324/657 |
| 8,144,126 B2* | 3/2012 | Wright | 345/173 |
| 2008/0251299 A1 | 10/2008 | Liao et al. | 178/18.06 |

FOREIGN PATENT DOCUMENTS

| | | |
|---|---|---|
| EP | 1 589 407 A1 | 10/2005 |
| EP | 1 847 916 A1 | 10/2007 |
| EP | 1 936 807 A1 | 6/2008 |
| WO | 2008/005505 A2 | 1/2008 |

OTHER PUBLICATIONS

International PCT Search Report and Written Opinion, PCT/US2010/044853, 14 pages, mailed Nov. 23, 2010.

* cited by examiner

*Primary Examiner* — Khai M Nguyen
(74) *Attorney, Agent, or Firm* — King & Spalding L.L.P.

(57) ABSTRACT

A pulse is applied through a capacitive touch key sensor to a sampling capacitor of an analog-to-digital converter (ADC). The voltage charge arriving at the sampling capacitor will be maximum when there is substantially no shunt capacitance between the capacitive touch key sensor and the sampling capacitor. However, a object such as an operator's finger when in close proximity to the capacitive touch key sensor will create a capacitive shunt to ground that diverts some of the charge that is supposed to go to the sampling capacitor and thereby reduces the voltage charge on the sampling capacitor. This change in charge voltage when the capacitive touch key sensor is activated (touched) may be easily detected with the ADC. In addition, light emitting diodes (LEDs) may be integrated with the capacitive touch key sensors and use the same connections on an integrated circuit device in a time division multiplexed manor.

20 Claims, 5 Drawing Sheets

(a)

(b)

though the switch matrix and a resulting voltage from the selected

CAPACITIVE KEY TOUCH SENSING USING ANALOG INPUTS AND DIGITAL OUTPUTS

RELATED PATENT APPLICATION

This application claims priority to commonly owned U.S. Provisional Patent Application Ser. No. 61/246,169; filed Sep. 28, 2009; entitled "Driving and Sensing Capacitive Key and LED Matrix with Digital-Output and Analog-Input Signals," by Chien-Yi Lin, and is hereby incorporated by reference herein for all purposes.

TECHNICAL FIELD

The present disclosure relates to sensing capacitive touch keys, and more particularly, to driving and sensing the capacitive touch keys using a minimum number of digital outputs and analog inputs. This disclosure further relates to an improved way of driving light emitting diodes (LEDs) that is more compatible with the driving and sensing of the capacitive touch keys described herein. The capacitive touch keys and LEDs may be arranged in a matrix, and used as an information display and control panel for many different types of appliances, electrical and electronic equipment, etc.

BACKGROUND

An industry standard for capacitive touch key sensing electronics is the Microchip Technology Inc., Charge Time Measurement Unit (CTMU) incorporated into various Microcontrollers manufactured by Microchip Technology Inc. See "Microchip CTMU for Capacitive Touch Applications, Microchip application note AN1250 (2009), hereby incorporated by reference herein for all purposes. The capacitive touch keys are used to detect the presence of a finger or other object that increases the capacitance of the touch key when brought in close proximity thereto, e.g., touching the key with the finger or object. The CTMU requires a constant current source, uses power and takes up valuable integrated circuit chip real estate.

The CTMU senses a change in capacitance of a touch key by charging the effective capacitance with a constant current source and then measuring the voltage thereon, after a certain time period. A larger capacitance being charged during the certain time period results in a lower voltage thereon then a smaller capacitance being charged under the same constant current charging and the certain time period. The CTMU samples the respective voltages on each one of the capacitive touch keys in the control matrix and when a lower voltage is detected then what would normally be on an untouched key, the CTMU and associated software detect the actuation of that key.

However, many factors influence the capacitance of the touch key when untouched and/or touched such as moisture, e.g., humidity or water, on the touch key. When only certain ones of the touch key matrix have moisture on them, the capacitances thereof my be different enough to cause false sensing by the CTMU of those keys having higher capacitance induced by the moisture.

In many applications for control and display, LEDs associated with each of the capacitive touch keys are also desirable. However, the LEDs must be driven and thereby require additional connections besides those required for the touch keys. It is possible to multiplex sensing and drive operations and thereby use common connections for the LEDs and touch key circuits, but the LED portion tends to degrade the operation of the touch key when both are coupled together.

Interfacing a capacitive key matrix with an integrated circuit microcontroller typically requires a plurality of analog inputs on the microcontroller. This limits the number of capacitive keys that may be detected when touched.

SUMMARY

The aforementioned problems are solved, and other and further benefits achieved by using an analog input of a microcontroller to detect changes in electrical charges of a capacitive key matrix when any one or more of the capacitive keys are touched. The electrical charges on the a capacitive keys are provided by digital output signals from the microcontroller. The number of keys in the matrix that must be sensed with analog inputs are no longer limited by the number of analog inputs available in the microcontroller.

According to a specific example embodiment of this disclosure, an integrated circuit device that senses actuation of a capacitive touch key comprises: an analog-to-digital converter (ADC) having a sampling capacitor, wherein the ADC converts an analog voltage on the sampling capacitor to a digital representation thereof; a digital processor coupled to a digital output of the ADC; a switch matrix controlled by the digital processor; a digital driver controlled by the digital processor; a first node adapted for coupling to a capacitive touch key, the first node is coupled to the sampling capacitor through the switch matrix; a second node adapted for coupling to the capacitive touch key, the second node is coupled to the digital driver through the switch matrix; wherein a voltage pulse from the digital driver and through the capacitive touch key charges the sampling capacitor to a first voltage in proportion to a capacitance ratio thereof, wherein when an object having a capacitance to a common potential is in close proximity to the capacitive touch sensor some of the voltage pulse through the capacitive touch sensor is diverted from the sampling capacitor to the common potential, and whereby the sampling capacitor is charged to a second voltage when the object is in close proximity to the capacitive touch key, were the second voltage is less than the first voltage.

According to another specific example embodiment of this disclosure, a system for sensing actuation of one or more of a plurality of capacitive touch keys comprises: a plurality of capacitive touch keys, an integrated circuit device having a plurality of external connections coupled to the plurality of capacitive touch keys, the integrated circuit device comprises: an analog-to-digital converter (ADC) having a sampling capacitor, wherein the ADC converts an analog voltage on the sampling capacitor to a digital representation thereof; a digital processor coupled to a digital output of the ADC; a switch matrix controlled by the digital processor, wherein the plurality of external connections are coupled to the switch matrix; a digital driver controlled by the digital processor, wherein the digital driver is coupled to the switch matrix; wherein a voltage pulse from the digital driver is coupled to a selected one of the plurality of capacitive touch keys through the switch matrix and a resulting voltage from the selected one of the plurality of capacitive touch keys charges the sampling capacitor to a first voltage in proportion to a capacitance ratio thereof, wherein when an object having a capacitance to a common potential is in close proximity to the selected one of the plurality of capacitive touch keys some of the voltage pulse through the selected one of the plurality of capacitive touch keys is diverted from the sampling capacitor to the common potential, and whereby the sampling capacitor is charged to a second voltage when the object is in close proximity to the capacitive touch key, were the second voltage is less than the first voltage.

According to yet another specific example embodiment of this disclosure, a method for sensing actuation of any one of a plurality of capacitive touch keys arranged in P(x) rows and A(y) columns comprises: setting P(x) rows and A(y) columns to a logic low for discharging any residual charges on a plurality of capacitive touch keys; coupling each of the A(y) columns to an analog input; generating a pulse on each of the P(x) rows for each of the A(y) columns; measuring an analog voltage associated with each of the plurality of capacitive touch keys that are generated by each of the pulses; storing the measured analog voltages associated with each of the plurality of capacitive touch keys; determining when any one of the stored measured analog voltages is below a certain voltage threshold; and indicating which one of the plurality of capacitive touch keys has the associated stored analog voltage below the certain voltage threshold.

BRIEF DESCRIPTION OF THE DRAWINGS

A more complete understanding of the present disclosure thereof may be acquired by referring to the following description taken in conjunction with the accompanying drawings wherein.

Figure 1:
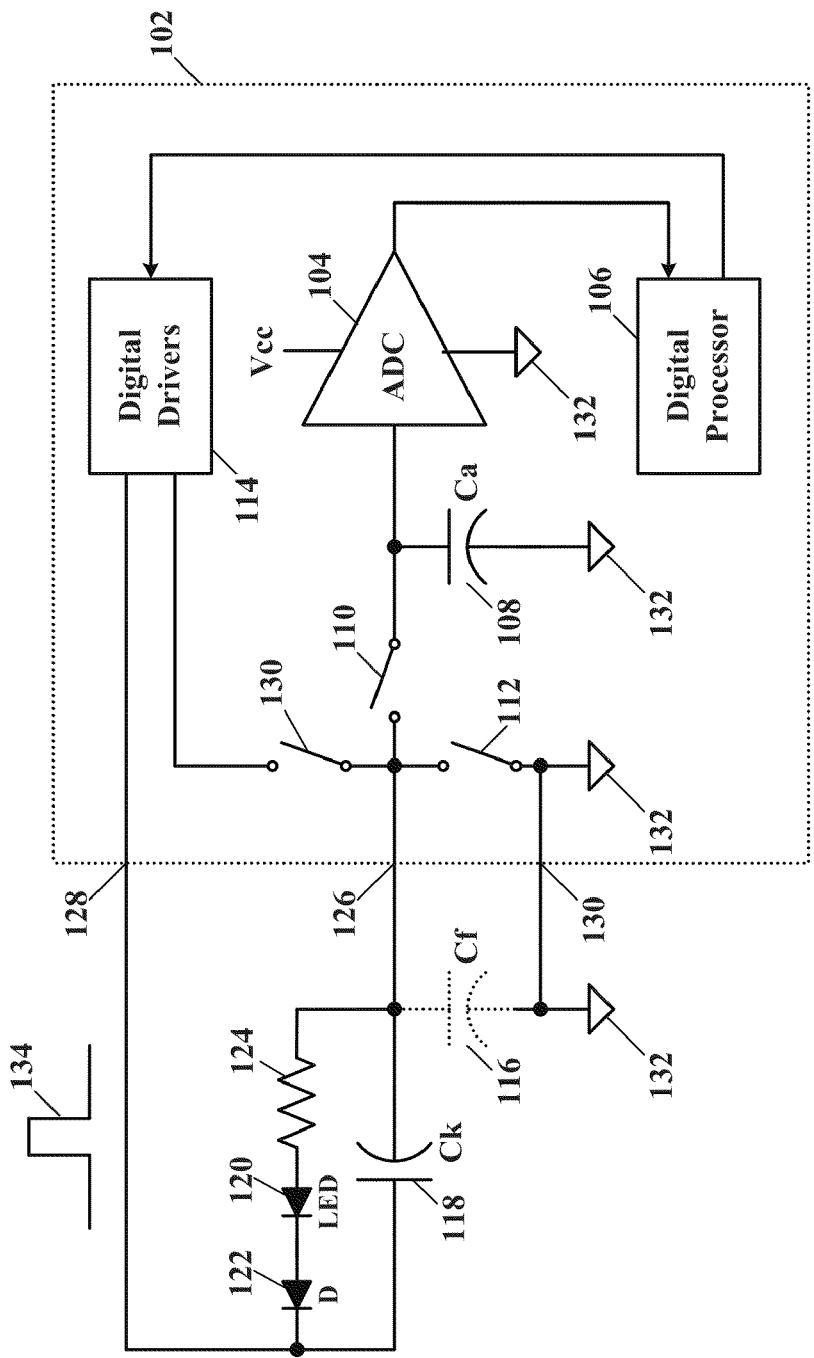
FIG. 1 illustrates a schematic diagram of a capacitive touch sensor key actuation detection and LED display circuit, according to a specific example embodiment of this disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Referring to FIG. 1, depicted is a schematic diagram of a capacitive touch sensor key actuation detection and LED display circuit, according to a specific example embodiment of this disclosure. An integrated circuit device 102 comprises an analog-to-digital converter (ADC) 104, a digital processor 106 having a memory (not shown), a sampling capacitor 108 that may be part of the ADC 104, digital drivers 114, and switches 110, 112, 114 and 130. Switches 110 and 130 may be part of an internal multiplexer, etc. Switch 112 may be an output driver of the digital drivers 114, e.g., totem-pole connected tri-state CMOS, open collector NMOS, etc. A single capacitive touch sensor key 118 and LED (light emitting diode) 120 are shown for illustrative purposes. As will be described herein, a plurality of capacitive touch sensor keys 118 and LEDs 120 may be configured as a control and display panel. The integrated circuit device 102 may be a mixed signal microcontroller, e.g., having both analog and digital circuits.

A pulse 134 from a digital driver 114 is applied to the capacitive touch sensor key 118 (capacitor Ck) and the resulting voltage pulse passing through the capacitance of the capacitive touch sensor key 118 to charge the sampling capacitor 108 (capacitor Ca). The voltage charge on the sampling capacitor 108 will be the voltage division resulting from the capacitance ratio of the capacitive touch sensor key 118 and the sampling capacitor 108. The resulting voltage charge on the sampling capacitor 108 is measured by the ADC 104.

When a finger actuates (e.g., comes in physical contact, touches, etc.) the capacitive touch sensor key 118, a shunt capacitance 116 (Cf) to ground is created that decreases the amplitude of the voltage pulse reaching the sampling capacitor 108 and subsequently being measured by the ADC 104. When the voltage charge measured on the sampling capacitor 108 is less than a previously measured voltage charge and/or a base reference voltage charge, then it is assumed that a finger, or other object that has capacitance to ground or common, has actuated the capacitive touch sensor key 118.

An advantage of the embodiment shown in FIG. 1 is that moisture does not substantially affect this capacitive touch sensor key actuation detection circuit because moisture may actually increase the capacitive value Ck of the capacitive touch sensor key 118, thus resulting in a larger voltage charge on the sampling capacitor 108 that is easily measured by the ADC 104. The embodiment shown in FIG. 1 reduces cost and enables faster detection times because no additional electronic components are required. Also the touch detection may be performed within a single low-to-high voltage step, e.g., rising edge of pulse 134, and thus no time consuming current integration is necessary as is required in a CTMU capacitive touch detection circuit.

Control of a LED 120 may also be easily implemented without requiring addition connections (pins) to the integrated circuit device 102. When it is desired to turn on the LED 120, switch 130 is closed, a digital driver 114 is coupled to the node 128 and controlled to be at a logic low, and a positive voltage from another digital driver 114 is applied to the LED 120 through the node 126 so that current passes through the LED 120, thereby resulting in an emission of light therefrom. This current flow through the LED 120 may be limited by the current limiting resistor 124. A current controlled voltage source (not shown) of the digital drivers 114 may also be used, thus eliminating the requirement for the current limiting resistor 124. Therefore, nodes, e.g., connections or pins, 126 and 128 may be used in a time division multiplexed manor for both detection of the actuation of the capacitive touch sensor key 118 and control of the LED 120.

Connecting the LED 120 reversely as shown to the driving signal will increase the capacitive value Ck of the capacitive touch sensor key 118 by the parasitic capacitance of the LED 120 and the resistor 124, thereby lowering the sensitivity of the key. By adding a high-speed switching diode 122, D, in series with the LED 120 and the resistor 124, the added parasitic capacitance influence (causing a reduction in touch sensitivity) is significantly reduced.

Figure 2:
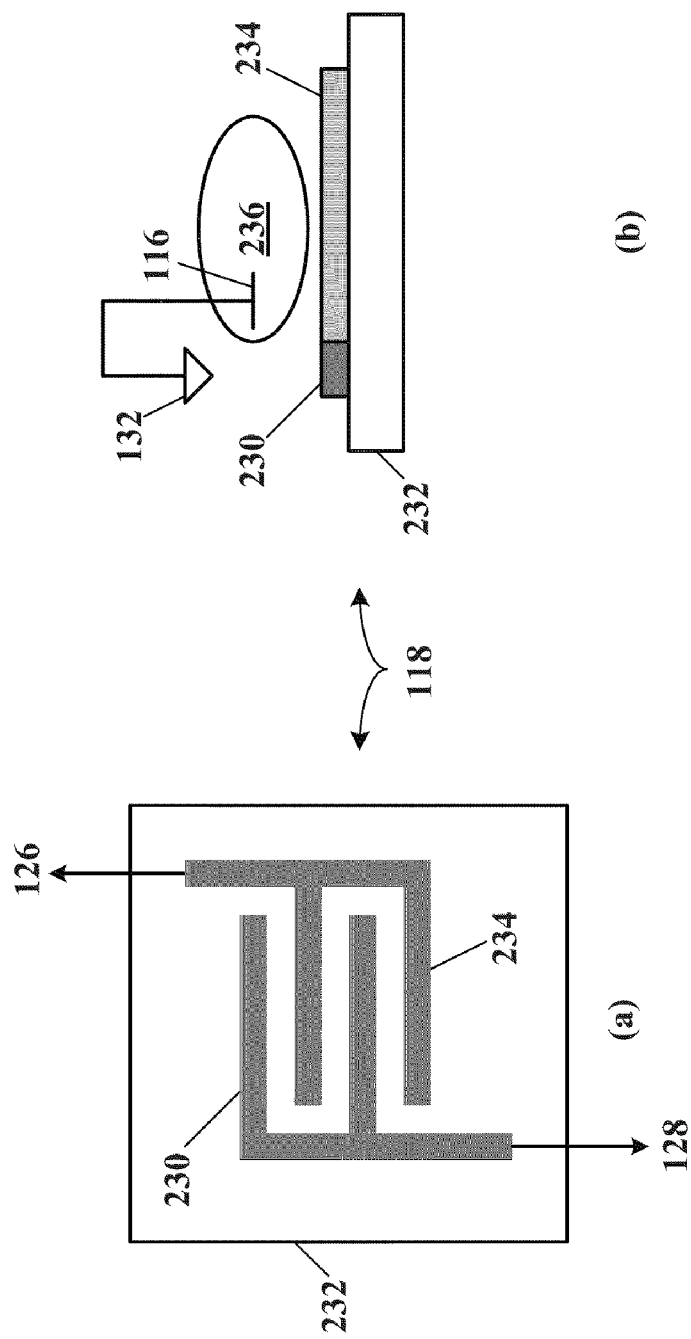
FIG. 2 illustrates schematic diagrams of plan and elevational views of a capacitive touch sensor key, according to a specific example embodiment of this disclosure.

Referring to FIG. 2, depicted are schematic diagrams of plan and elevational views of a capacitive touch sensor key, according to a specific example embodiment of this disclosure. The capacitive touch sensor key 118 comprises capacitor plates 230 and 234 on a face of an insulated substrate 232.

The capacitor plates 230 and 234 are coupled to the nodes (connections or pins) 128 and 126, respectively. When a finger 236 comes in close proximity to the capacitor plates 230 and 234, the inherent capacitance (capacitor 116 of FIG. 1) of the finger 236 will shunt some of the voltage charge passing through the capacitive touch sensor key 118 on the way to the sampling capacitor 108. In other words, the finger shunt capacitor 116 diverts some of the voltage charge intended for the sampling capacitor 108, thereby reducing the resulting voltage charge measured by the ADC 104.

Figure 3:
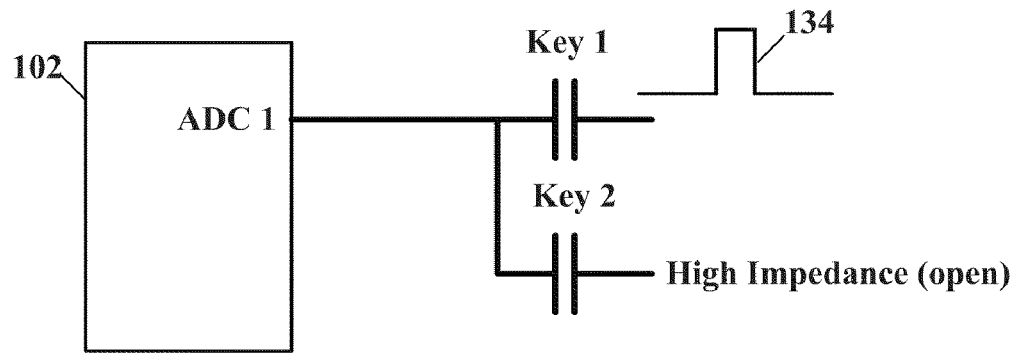
FIG. 3 illustrates schematic diagrams of some connection configurations of the capacitive touch sensor keys, according to the teachings of this disclosure.
Figure 3:
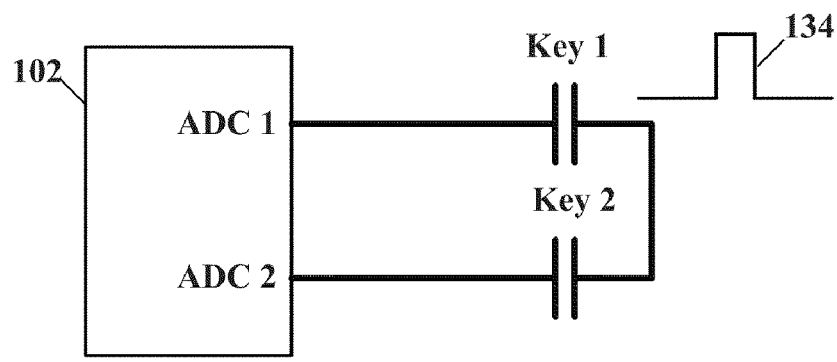

Referring to FIG. 3, depicted are schematic diagrams of some connection configurations of the capacitive touch sensor keys, according to the teachings of this disclosure. In the configuration shown in the schematic diagram (a), signal pulses 134 are sent from an output of a digital driver 114 to only one of the capacitive touch sensor keys (key 1) shown in (a) and the other one of the capacitive touch sensor keys (key 2) shown in (a) has no pulses 134 coupled thereto. Before a finger touching the any of these capacitive touch sensor keys, the voltage level detected by an analog input of the integrated circuit device 102 is high. When a finger touches the upper key 1 while the driving signal (pulses 134) is applied, the voltage drops significantly at the ADC 1 analog input. However, when a finger touches the lower key 2 while the driving signal (pulses 134) is applied, the voltage at the ADC 1 analog input just drops a little. This happens because the charge sent from the driving signal (pulses 134) can only be taken away by a finger touch when the finger touches the upper key. Based on this observation, if the driving signal is only from a row of a key matrix, and the analog input detects a big voltage drop, one can tell the finger touch happens on the same row, not on the other rows.

In the configuration shown in the schematic diagram (b), signal pulses 134 are sent from an output of a digital driver 114 to both of the capacitive touch sensor keys (keys 1 and 2), and both of them are very sensitive to a finger touch. When a finger touches one of these keys (e.g., key 1), the analog input (ADC 1) coupled thereto will sense a significant voltage drop, while the other analog input (ADC 2) coupled to key 2 will sense an insignificant voltage drop when no finger touch is present. This happens because the additional capacitance caused by the finger lowers the impedance (finger capacitive coupling) of the key 1 to ground. By combining selected connection configurations of (a) and (b), use of only digital outputs and analog input(s) are required to detect a finger touch in a capacitive key matrix.

Figure 4:
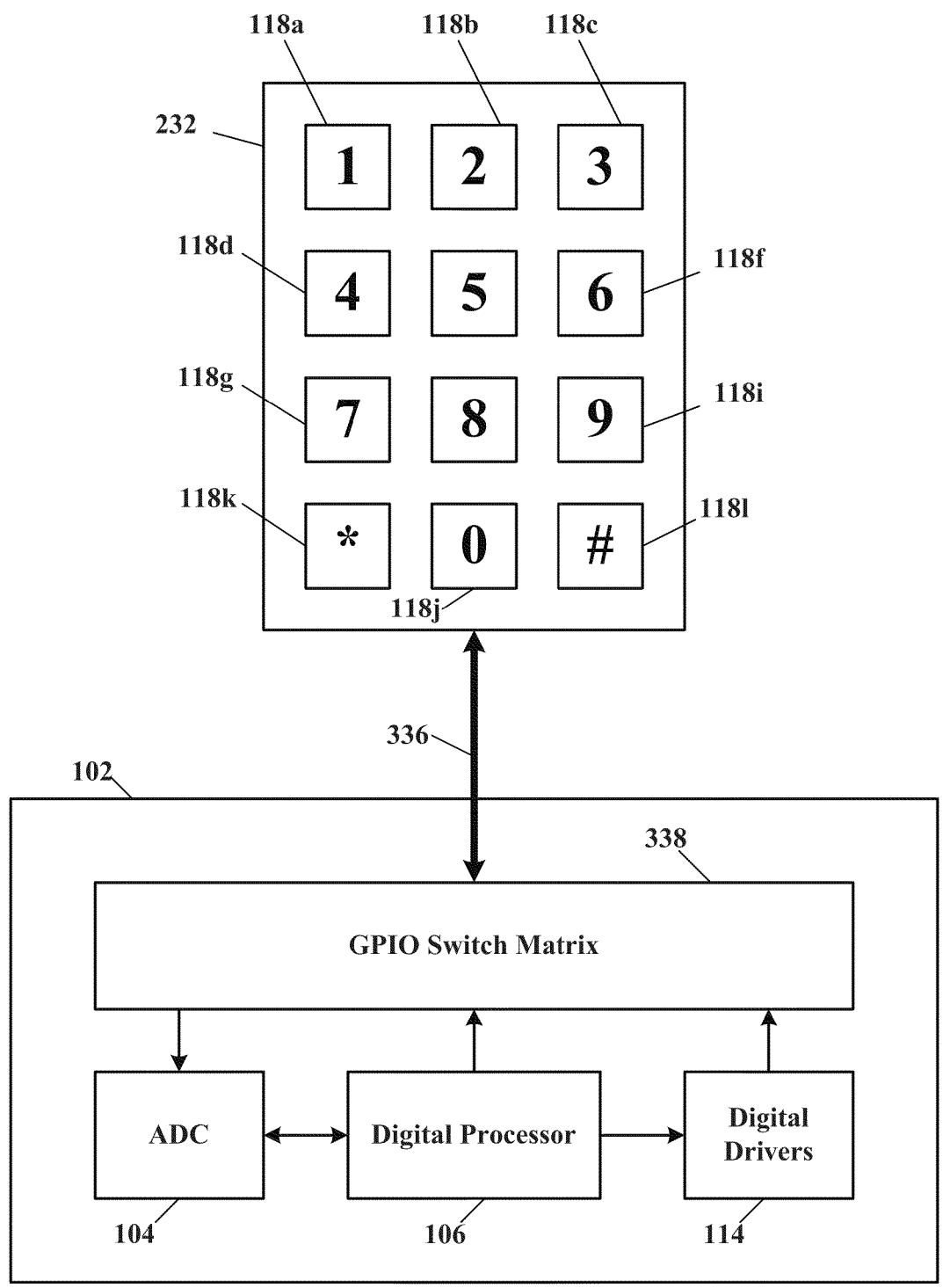
FIG. 4 illustrates a schematic block diagram of a matrix of capacitive touch keys and LEDs, according to another specific example embodiment of this disclosure.
Figure 5:
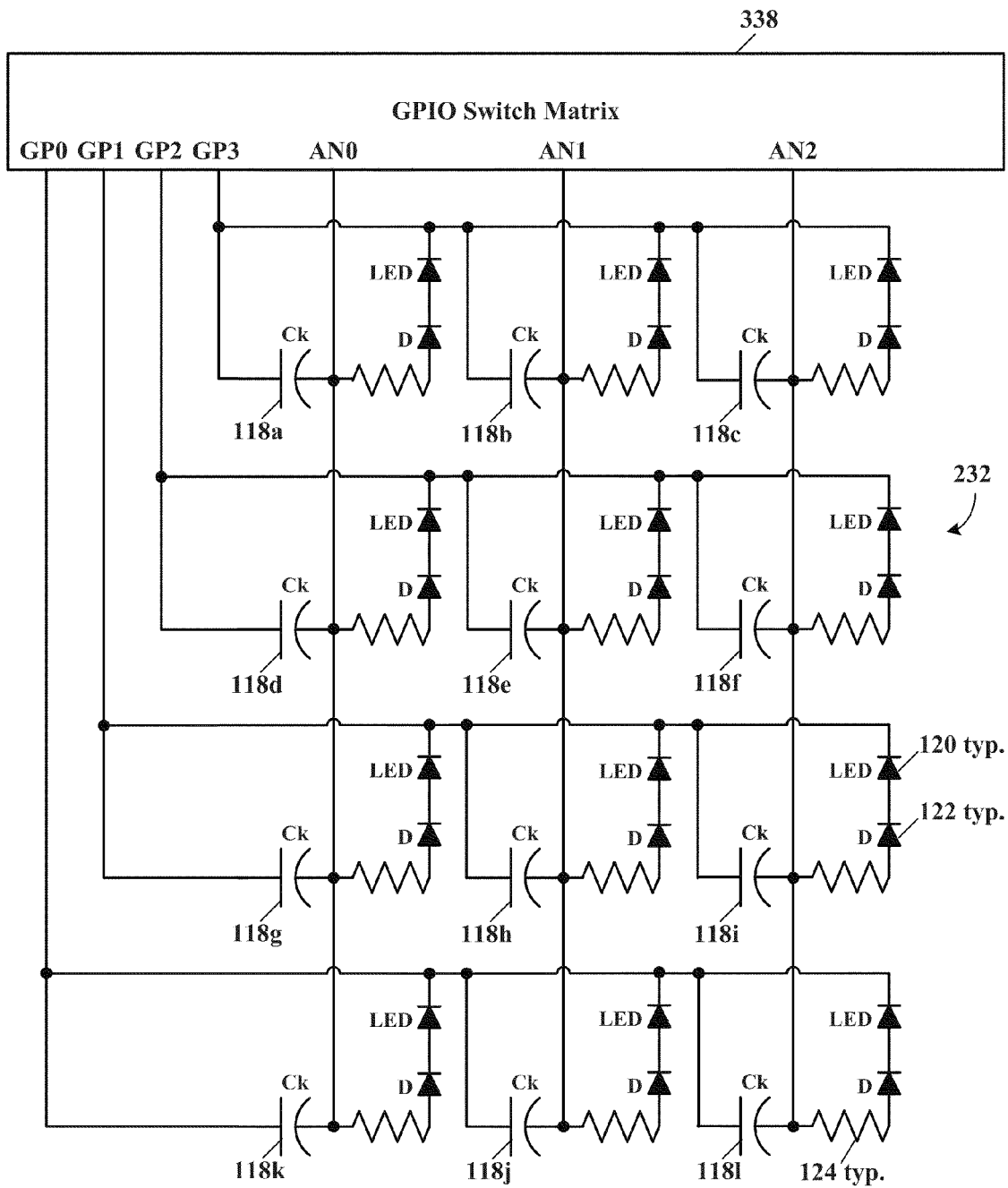
FIG. 5 illustrates a more detailed schematic diagram of the matrix of capacitive touch keys and LEDs shown in FIG. 3.

Referring to FIGS. 4 and 5, depicted in FIG. 4 is a schematic block diagram of a matrix of capacitive touch keys and LEDs, and depicted in FIG. 5 is a more detailed schematic diagram of the matrix of capacitive touch keys and LEDs shown in FIG. 4, according to a specific example embodiment of this disclosure. The capacitive touch keys 118 may be sensed and the LEDs 120 (shown in FIG. 5) driven over common connections (same device pins) by time division multiplexing of the sensing and driving operations for each of the keys 118 and LEDs 120, in combination with the switch matrix 338 of the integrated circuit device 102. The switch matrix 338 may be, for example but not limited to, a multiplexer or switching matrix, e.g., a general purpose input-output (GPIO), that allows any signal connection of the integrated circuit device 102 to be an analog input or output, a digital output, or a digital input at any particular time.

Referring now to FIG. 5, an example of a key actuation detection operation (e.g., sensing voltage changes from the key matrix) may be as follows:
1) Set all AN0-AN2 and GP0-GP3 nodes to an output logic low to discharge all capacitive touch keys 118,
2) change AN0-AN2 nodes from output logic lows to analog inputs,
3) drive an output logic high (pulse) from the GP0 node and measure the analog voltage value at AN(y) analog input node where x=0,
4) repeat steps 1) to 3) for each AN(y) analog input node, where y=1 or 2, to obtain analog voltage values at each of the AN0-AN2 analog input nodes when excited (pulsed) from the digital output GP(x) node, where x=0,
5) if any of the analog input node AN0-AN2 has a significant change in value (less) then one or more of the capacitive keys is pressed, and then
6) repeat steps 1) to 5) using drive (pulse) signals from GP(x), where x=1, 2 or 3 to complete scanning of all capacitive touch keys 118.

For example, when the capacitive touch key 118a at the intersection of AN0 and GP3 is actuated by a finger touch the following voltages at the analog inputs AN0-AN2 are as follows of each instance of a pulse from the digital outputs GP3-GP0 in time sequence:

|  | AN0 | AN1 | AN2 |
| --- | --- | --- | --- |
| GP3 = pulse | low | high | high |
| GP2 = 0 | 0 | 0 | 0 |
| GP1 = 0 | 0 | 0 | 0 |
| GP0 = 0 | 0 | 0 | 0 |
| GP3 = 0 | 0 | 0 | 0 |
| GP2 = pulse | high | high | high |
| GP1 = 0 | 0 | 0 | 0 |
| GP0 = 0 | 0 | 0 | 0 |
| GP3 = 0 | 0 | 0 | 0 |
| GP2 = 0 | 0 | 0 | 0 |
| GP1 = pulse | high | high | high |
| GP0 = 0 | 0 | 0 | 0 |
| GP3 = 0 | 0 | 0 | 0 |
| GP2 = 0 | 0 | 0 | 0 |
| GP1 = 0 | 0 | 0 | 0 |
| GP0 = pulse | high | high | high |

From the example tables above, the voltage on AN0 is low only when there is a pulse on GP3. This is because when there is the pulse on GP3, voltage at the GP3 connected side of the capacitor 118a (Ck) will be lowered by the finger touch of the capacitor 118a (Ck), and will thereby lower the voltage on the other side of the capacitor 118a (Ck) connected to the analog input (AN0) and further coupled to the input of the ADC 104 (see FIG. 1).

To turn on an LED 120, between key actuation detection operations, a GP(x) node of a row is set to a logic low output and an AN(y) node of a column is set to a logic high output. All of other row and column nodes may remain in a high-Z disconnected state (e.g., tri-state output off). Current will flow through the LED 120 at the intersection of the GP(x) node row and the AN(y) node column producing light. By alternating in time (time division multiplexing) the touch sense and LED drive operations, the very same nodes through the GPIO switch matrix 338 of the integrated circuit device 102 may be utilized. Thus, a three by four matrix panel will only require seven (7) nodes (connections) of which three (3) are analog inputs, the other four (4) are digital outputs for touch key monitoring, and for LED excitation all seven (7) nodes will be switched to digital outputs by the GPIO switch matrix 338. Likewise, a four by five matrix will only require nine (9) nodes, connections, etc., to the integrated circuit device 102 for both touch sensing and LED driving of a control and display panel, according to the teachings of this disclosure.

An advantage of the circuits disclosed in FIGS. 1-5 is when the low-to-high step signal (pulse 134) is sent, the impedance of capacitive touch key 118 (capacitor Ck) is very low (small), compared to the impedance of the series connected resistor 124 and the reversed biased LED 120 and high speed switching diode 122. Therefore, the existence of the resistor 124, LED 120 and diode 124 can be ignored when detecting voltages representing actuation (touch) of a key 118.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An integrated circuit device that senses actuation of a capacitive touch key, comprising:
   an analog-to-digital converter (ADC) having a sampling capacitor, wherein the ADC converts an analog voltage on the sampling capacitor to a digital representation thereof;
   a digital processor coupled to a digital output of the ADC;
   a switch matrix controlled by the digital processor;
   a digital driver controlled by the digital processor;
   a first node adapted for coupling to a capacitive touch key, the first node is coupled to the sampling capacitor through the switch matrix;
   a second node adapted for coupling to the capacitive touch key, the second node is coupled to the digital driver through the switch matrix;
   wherein a voltage pulse from the digital driver and through the capacitive touch key charges the sampling capacitor to a first voltage in proportion to a capacitance ratio thereof,
   wherein when an object having a capacitance to a common potential is in close proximity to the capacitive touch sensor some of the voltage pulse through the capacitive touch sensor is diverted from the sampling capacitor to the common potential, and
   whereby the sampling capacitor is charged to a second voltage when the object is in close proximity to the capacitive touch key, wherein the second voltage is less than the first voltage.

2. The integrated circuit device according to claim 1, wherein the object is a finger.

3. The integrated circuit device according to claim 1, wherein the common potential is substantially ground potential.

4. The integrated circuit device according to claim 1, wherein the digital processor stores in a memory thereof digital representations of voltages from the ADC, when at least one of the digital representations of voltages stored in memory is less than the others, a signal is generated indicating that the capacitive touch key was actuated.

5. The integrated circuit device according to claim 1, further comprising a light emitting diode (LED) and a high speed switching diode connected in series, and the series connected LED and high speed switching diode are coupled in parallel with the capacitive touch key, wherein the LED is turned on when the switch matrix couples the first node to a logic high and the second node to a logic low.

6. The integrated circuit device according to claim 5, wherein the voltage pulse from the digital driver is generated and the LED is turned on during alternate time periods.

7. The integrated circuit device according to claim 5, wherein the capacitive touch key and the LED use common connections.

8. The integrated circuit device according to claim 1, wherein the integrated circuit device is a mixed signal microcontroller.

9. A system for sensing actuation of one or more of a plurality of capacitive touch keys, said system comprising:
   a plurality of capacitive touch keys,
   an integrated circuit device having a plurality of external connections coupled to the plurality of capacitive touch keys, the integrated circuit device comprising:
      an analog-to-digital converter (ADC) having a sampling capacitor, wherein the ADC converts an analog voltage on the sampling capacitor to a digital representation thereof;
      a digital processor coupled to a digital output of the ADC;
      a switch matrix controlled by the digital processor, wherein the plurality of external connections are coupled to the switch matrix;
      a digital driver controlled by the digital processor, wherein the digital driver is coupled to the switch matrix;
      wherein a voltage pulse from the digital driver is coupled to a selected one of the plurality of capacitive touch keys through the switch matrix and a resulting voltage from the selected one of the plurality of capacitive touch keys charges the sampling capacitor to a first voltage in proportion to a capacitance ratio thereof,
      wherein when an object having a capacitance to a common potential is in close proximity to the selected one of the plurality of capacitive touch keys some of the voltage pulse through the selected one of the plurality of capacitive touch keys is diverted from the sampling capacitor to the common potential, and
      whereby the sampling capacitor is charged to a second voltage when the object is in close proximity to the capacitive touch key, wherein the second voltage is less than the first voltage.

10. The system according to claim 9, wherein the object is a finger.

11. The system according to claim 9, wherein the common potential is substantially ground potential.

12. The system according to claim 9, wherein the digital processor stores in a memory thereof digital representations of voltages from the ADC for each one of the plurality of capacitive touch keys, wherein when a digital representation of a voltage sampled by the ADC is less then a respective one of the stored voltage representations in memory, a signal is generated indicating that an associated one of the plurality of capacitive touch keys was actuated.

13. The system according to claim 9, further comprising a plurality of light emitting diodes (LEDs) and a plurality of high speed switching diodes, wherein a selected one of the plurality of LEDs is turned on when the switch matrix couples logic high and logic low levels to the selected one of the plurality of LEDs so as to cause current to flow therethrough, wherein the plurality of light emitting diodes (LEDs) are connected is series with respective ones of the plurality of high speed switching diodes and the series connected plurality of LEDs and high speed switching diodes are coupled in parallel with respective ones of the plurality of capacitive touch keys.

14. The system according to claim 13, wherein the voltage pulse from the digital driver is generated and the LED is turned on during alternate time periods.

15. The system according to claim 13, wherein the plurality of capacitive touch sensors and respective ones of the plurality of LEDs are coupled to the same external connections.

16. The system according to claim 9, wherein the integrated circuit device is a mixed signal microcontroller.

17. A method for sensing actuation of any one of a plurality of capacitive touch keys arranged in P(x) rows and A(y) columns, said method comprising the steps of:
setting P(x) rows and A(y) columns to a logic low for discharging any residual charges on a plurality of capacitive touch keys;
coupling each of the A(y) columns to an analog input;
generating a pulse on each of the P(x) rows for each of the A(y) columns;
measuring an analog voltage associated with each of the plurality of capacitive touch keys that are generated by each of the pulses;
storing the measured analog voltages associated with each of the plurality of capacitive touch keys;
determining when any one of the stored measured analog voltages is below a certain voltage threshold; and
indicating which one of the plurality of capacitive touch keys has the associated stored analog voltage below the certain voltage threshold.

18. The method according to claim 17, wherein the step of measuring the analog voltages is done with an analog-to-digital converter (ADC) that converts each of the measured analog voltages into digital voltage values.

19. The method according to claim 18, wherein the digital voltage values are stored in a memory.

20. The method according to claim 19, wherein the step of determining when any one of the stored measured analog voltages is below a certain voltage threshold is done with a microcontroller and the digital voltage values stored in the memory.

* * * * *